United States Patent
Wen

(10) Patent No.: US 9,401,441 B2
(45) Date of Patent: Jul. 26, 2016

(54) BACK-ILLUMINATED IMAGE SENSOR WITH DISHING DEPRESSION SURFACE

(75) Inventor: Tseng-Fei Wen, Hsinchu County (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 507 days.

(21) Appl. No.: 13/517,858

(22) Filed: Jun. 14, 2012

(65) Prior Publication Data

US 2013/0334636 A1 Dec. 19, 2013

(51) Int. Cl.
*H01L 31/00* (2006.01)
*H01L 31/0232* (2014.01)
*H01L 27/146* (2006.01)

(52) U.S. Cl.
CPC ...... *H01L 31/02327* (2013.01); *H01L 27/1463* (2013.01); *H01L 27/1464* (2013.01); *H01L 27/14698* (2013.01); *H01L 27/14621* (2013.01); *H01L 27/14627* (2013.01)

(58) Field of Classification Search
CPC ............. H01L 31/02327; H01L 31/0232; H01L 31/18; H01L 27/14621; H01L 27/14627; H01L 27/1463; H01L 27/1464; H01L 27/14698
See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |

(Continued)

OTHER PUBLICATIONS

Taiwan Patent Office, Office Action issued on May 18, 2016, Taiwan.

*Primary Examiner* — Caleb Henry
*Assistant Examiner* — Alexander Belousov
(74) *Attorney, Agent, or Firm* — WPAT, PC; Justin King

(57) ABSTRACT

A fabricating method of a back-illuminated image sensor includes the following steps. First, a silicon wafer having a first surface and a second surface is provided, wherein a number of trench isolations are formed in the first surface, and at least one image sensing member is formed between the trench isolations. Then, a first chemical mechanical polishing (CMP) process is performed to the second surface using the trench isolations as a polishing stop layer to thin the silicon wafer. Because the polishing rate of the silicon material in the silicon wafer is different with that of the isolation material of the trench isolations in the first CMP process, at least one dishing depression is formed in the second surface of the silicon wafer. Finally, a microlens is formed above the dishing depression, and a surface of the microlens facing the dishing depression is a curved surface.

8 Claims, 3 Drawing Sheets

(56) References Cited

U.S. PATENT DOCUMENTS

| | | | |
|---|---|---|---|
| 6,081,018 A | 6/2000 | Nakashiba | |
| 6,087,211 A | 7/2000 | Kalnitsky | |
| 6,124,200 A | 9/2000 | Wang | |
| 6,294,313 B1 | 9/2001 | Kobayashi | |
| 6,297,160 B1 | 10/2001 | Chien | |
| 6,338,976 B1 | 1/2002 | Huang | |
| 6,352,876 B1 | 3/2002 | Bordogna | |
| 6,369,417 B1 | 4/2002 | Lee | |
| 6,376,797 B1 | 4/2002 | Piwczyk | |
| 6,388,278 B1 | 5/2002 | Suzuki | |
| 6,407,415 B2 | 6/2002 | Lee | |
| 6,433,844 B2 | 8/2002 | Li | |
| 6,482,669 B1 | 11/2002 | Fan | |
| 6,514,810 B1 | 2/2003 | Kim | |
| 6,566,151 B2 | 5/2003 | Yeh | |
| 6,617,189 B1 | 9/2003 | Chen | |
| 6,632,700 B1 | 10/2003 | Fan | |
| 6,641,464 B1 | 11/2003 | Steere, III | |
| 6,664,191 B1 | 12/2003 | Kim | |
| 6,730,555 B2 | 5/2004 | Kim | |
| 6,794,215 B2 | 9/2004 | Park | |
| 6,821,809 B2 | 11/2004 | Abe | |
| 6,841,848 B2 | 1/2005 | MacNamara | |
| 6,846,722 B2 | 1/2005 | Lee | |
| 6,849,533 B2 | 2/2005 | Chang | |
| 6,872,584 B2 | 3/2005 | Nakashiba | |
| 6,921,934 B2 | 7/2005 | Patrick | |
| 6,933,972 B2 | 8/2005 | Suzuki | |
| 6,953,608 B2 | 10/2005 | Leu | |
| 6,960,512 B2 | 11/2005 | Cheng | |
| 7,006,294 B2 | 2/2006 | Steenblik | |
| 7,078,779 B2 | 7/2006 | Wang | |
| 7,115,924 B1 | 10/2006 | LaMaster | |
| 7,129,172 B2 | 10/2006 | Morrow | |
| 7,180,044 B2 | 2/2007 | Yu | |
| 7,199,439 B2 | 4/2007 | Farnworth | |
| 7,229,745 B2 | 6/2007 | Lamarre | |
| 7,238,915 B2 | 7/2007 | Grek et al. | |
| 7,315,359 B2 | 1/2008 | Hong | |
| 7,328,915 B2 | 2/2008 | Smith | |
| 7,498,190 B2 * | 3/2009 | Kao | 438/98 |
| 7,648,851 B2 | 1/2010 | Fu | |
| 2001/0023086 A1 | 9/2001 | Park | |
| 2004/0122328 A1 | 6/2004 | Wang | |
| 2005/0024520 A1 | 2/2005 | Yamamoto | |
| 2005/0103983 A1 | 5/2005 | Yamaguchi | |
| 2005/0121599 A1 | 6/2005 | Mouli | |
| 2005/0186739 A1 | 8/2005 | Wang | |
| 2005/0247963 A1 | 11/2005 | Chen | |
| 2005/0274988 A1 | 12/2005 | Hong | |
| 2005/0274996 A1 | 12/2005 | Iwawaki | |
| 2006/0054946 A1 | 3/2006 | Baek | |
| 2006/0124833 A1 | 6/2006 | Toda | |
| 2006/0146230 A1 | 7/2006 | Joon | |
| 2006/0146412 A1 | 7/2006 | Kim | |
| 2006/0172451 A1 | 8/2006 | Park | |
| 2006/0183265 A1 | 8/2006 | Oh | |
| 2006/0231898 A1 | 10/2006 | Jeong | |
| 2007/0010042 A1 | 1/2007 | Li | |
| 2007/0012970 A1 | 1/2007 | Mouli | |
| 2007/0018073 A1 | 1/2007 | Hsu | |
| 2007/0018212 A1* | 1/2007 | Shibayama | H01L 27/1446 257/292 |
| 2007/0023851 A1 | 2/2007 | Hartzell | |
| 2007/0031988 A1 | 2/2007 | Agranov | |
| 2007/0052050 A1 | 3/2007 | Dierickx | |
| 2007/0072326 A1 | 3/2007 | Zheng | |
| 2007/0096173 A1 | 5/2007 | Kim | |
| 2007/0117253 A1 | 5/2007 | Hsu | |
| 2007/0158772 A1 | 7/2007 | Boettiger | |
| 2007/0166649 A1 | 7/2007 | Yu | |
| 2007/0202696 A1 | 8/2007 | Inuiya | |
| 2007/0210395 A1 | 9/2007 | Maruyama et al. | |
| 2008/0036020 A1 | 2/2008 | Ko | |
| 2008/0055733 A1 | 3/2008 | Lim | |
| 2008/0061330 A1 | 3/2008 | Shiau et al. | |
| 2008/0079103 A1 | 4/2008 | Liao | |
| 2008/0121805 A1 | 5/2008 | Tweet | |
| 2008/0121951 A1 | 5/2008 | Kao | |
| 2008/0157144 A1 | 7/2008 | Lee | |
| 2008/0169546 A1 | 7/2008 | Kwon | |
| 2008/0265348 A1 | 10/2008 | Maas | |
| 2009/0066954 A1 | 3/2009 | Opsal | |
| 2009/0090937 A1* | 4/2009 | Park | 257/252 |
| 2009/0121264 A1 | 5/2009 | Kao | |
| 2009/0124037 A1 | 5/2009 | Yu | |
| 2009/0127643 A1 | 5/2009 | Lu | |
| 2009/0134484 A1 | 5/2009 | Lin | |
| 2009/0168181 A1 | 7/2009 | Su | |
| 2009/0200585 A1 | 8/2009 | Nozaki | |
| 2009/0212335 A1 | 8/2009 | Kao | |
| 2009/0256258 A1 | 10/2009 | Kreupl | |
| 2009/0294888 A1 | 12/2009 | Tsai | |
| 2009/0321862 A1 | 12/2009 | Yu | |
| 2010/0003623 A1 | 1/2010 | Liu | |
| 2010/0038688 A1 | 2/2010 | Wu | |
| 2010/0044813 A1 | 2/2010 | Wu | |
| 2010/0096359 A1 | 4/2010 | Shiu | |
| 2010/0144156 A1 | 6/2010 | Shih | |
| 2010/0159632 A1 | 6/2010 | Rhodes | |
| 2010/0315734 A1 | 12/2010 | Wu | |
| 2010/0323470 A1 | 12/2010 | Venezia | |
| 2011/0057277 A1 | 3/2011 | Yu | |
| 2011/0242376 A1 | 10/2011 | Ando | |

* cited by examiner

BACK-ILLUMINATED IMAGE SENSOR WITH DISHING DEPRESSION SURFACE

TECHNICAL FIELD

The present invention relates generally to image sensors, and more particularly relates to a back-illuminated image sensor and a fabricating method thereof.

BACKGROUND

Generally, in a fabricating method for a back-illuminated image sensor, sensing elements, a signal processing member, a dielectric layer, and metal wires are firstly finished on a front side of a silicon wafer. After that, a thinning process is performed on a back side of the silicon wafer to thin a thickness of the silicon wafer from several hundred micrometers to several micrometers, for example, from 750 micrometers to 3 micrometers. Then, optical members such as color filter and microlens are formed on a back surface of the thinned silicon wafer to introduce light beams from the back surface. In such a configuration, the light beams wouldn't be blocked by the metal wires. However, it is very difficult to accurately control the thinning process such that the thinned wafer after thinned several hundred micrometers has good cross-wafer uniformity and wafer-to-wafer uniformity. If the cross-wafer is over-thinned or unevenly thinned, the sensors on the front surface would be damaged or reduce the performance of the optical members on the back surface of the silicon wafer, and also the wafer-to-wafer thickness uniformity would affect the quality of the image sensors.

Therefore, how to solve the above problems and improve the yield rate and the performance of back-illuminated image sensors is an objective of the present invention.

SUMMARY

In one embodiment, a fabricating method of a back-illuminated image sensor is provided. The method includes the following steps. First, a silicon wafer is provided and the silicon wafer includes a first surface and a second surface. A number of trench isolations are formed at the first surface, and at least one image sensing member is formed between the trench isolations. Then, a first chemical mechanical polishing (CMP) process is performed on the second surface to thin the silicon wafer using the trench isolations as a polishing stop layer. In the first CMP process, the polishing rate of the silicon material in the silicon wafer is different from that of the isolation material in the trench isolations. As a result, at least one dishing depression is formed in portions of the second surface of the silicon wafer that are between the trench isolations. Finally, a microlens is formed above the dishing depression, and a surface of the microlens facing the dishing depressions is a curved surface.

In another embodiment, a back-illuminated image sensor is provided. The back-illuminated image sensor includes a silicon wafer and at least one microlens. The silicon wafer includes a first surface and a second surface, wherein at least one image sensing member and at least one peripheral circuit are formed on the first surface. The microlens is disposed above the second surface, and a surface of the microlens that is adjacent to the second surface of the silicon wafer is a curved surface.

In the fabricating method of the back-illuminated image sensor, the CMP process, which is used to thin the silicon wafer has high polishing rate selectivity since the trench isolations are employed as the polishing stop layer. Thus, the thinned silicon wafer has good cross-wafer thickness uniformity and wafer-to-wafer thickness uniformity. In addition, the surface of the microlens adjacent to the second surface of the silicon wafer of the back-illuminated image sensor is a curved surface. Therefore, the incident light can be accurately focused onto the image sensing member thereby improving the performance of the back-illuminated sensor.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIG. 1A to FIG. 1E are schematic views illustrating a part of steps of a fabricating method of a back-illuminated image sensor in accordance with an embodiment.

Figure 1A:
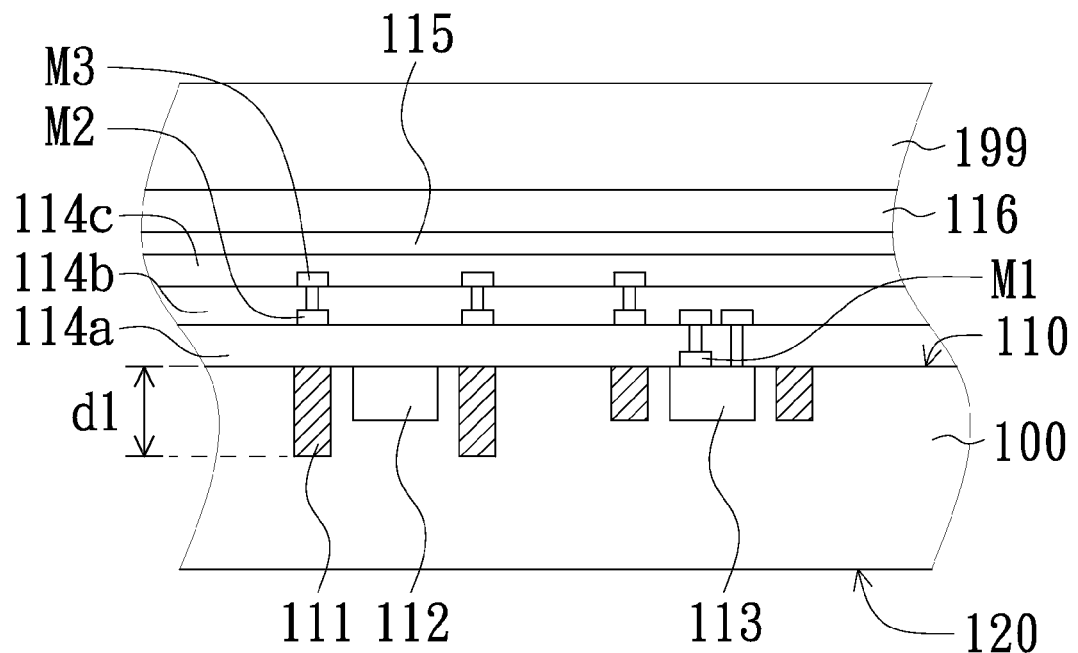
FIG. 1A to FIG. 1E are schematic views illustrating a part of steps of a fabricating method of a back-illuminated image sensor in accordance with an embodiment.

Referring to the cross sectional view shown in FIG. 1A, first, a silicon wafer 100 is provided. The silicon wafer includes a first surface 110 and a second surface 120. A number of deep trench isolations 111 are formed in the first surface 110, and at least one image sensing member 112 is formed between two deep trench isolations 111. At least one peripheral circuit 113 is formed aside the image sensing member 112. After that, dielectric layers 114a, 114b and 114c are sequentially formed on the first surface 110, and metal conducting wires M1, M2 and M3 are formed in the dielectric layers 114a, 114b and 114c, respectively. Then, an electrode layer 115 is formed on the outmost dielectric layer 114c, and an insulator layer 116 is also formed on the electrode layer 116. In addition, a carrier wafer 199 is bonded onto the insulator layer 116. In the present embodiment, a vertical depth d1 of the deep trench isolations 111 is not greater than 3 micrometers. The image sensing member 112 between the deep trench isolations 111, for example, is a photodiode for receiving external light beams and converts the received light beams into electrical charges. The peripheral circuit 1113, for example, is a signal process circuit consisting of metal oxide semiconductor transistors for reading the electrical charges from the photodiode and converting the electrical charges into digital image signals. It is to be noted that, the number of the dielectric layers and the metal conducting wires on the first surface can be varied according to practical requirements when the present embodiment is implemented, and FIG. 1 is an exemplary illustration and is not intended to be used to limit the method, type or number of the dielectric layers, the metal conducting wires and the peripheral circuit.

Figure 1B:
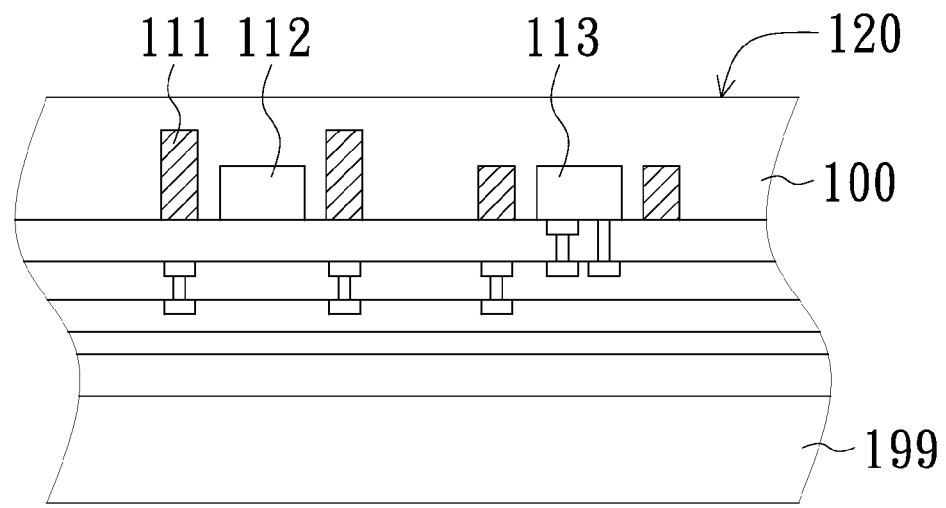

Referring to the cross sectional view shown in FIG. 1B, after the carrier wafer 199 is bonded onto the silicon wafer 100; the silicon wafer 100 is inverted using the carrier wafer 199 as a support. Then, a thinning process is performed on the second surface 120 to reduce a thickness of the silicon wafer 100 to about 3 micrometers while doesn't expose a surface of the deep trench isolations 111. The thinning process includes a second CMP process, or an etching process, or the both. For example, the second CMP process can be performed firstly to reduce the thickness of the silicon wafer to about 40 micrometers, and then the etching process can be used to reduce the thickness of the silicon wafer 100 to about 3 micrometers. Alternatively, the etching process can be performed firstly and then the second CMP process is performed. Furthermore, the second CMP process and the etching process can also be performed alternately to reduce the thickness of the silicon wafer. That is, the present embodiment doesn't limit the sequence of the thinning process. A primary objective of the thinning process is to quickly reduce the thickness of the silicon wafer. Thus, it is not necessary to consider the selectivity of the slurry used in the second CMP process or the etchant used in the etching process, and the only thing should be considered is the polishing rate and the etching rate to the silicon material. The process time of the thinning process is controlled. For example, the thinning process should be terminated when the thickness of the silicon wafer 100 is less than a predetermined value such as 3 micrometers such that the deep trench isolations 111 are not exposed.

Figure 1C:
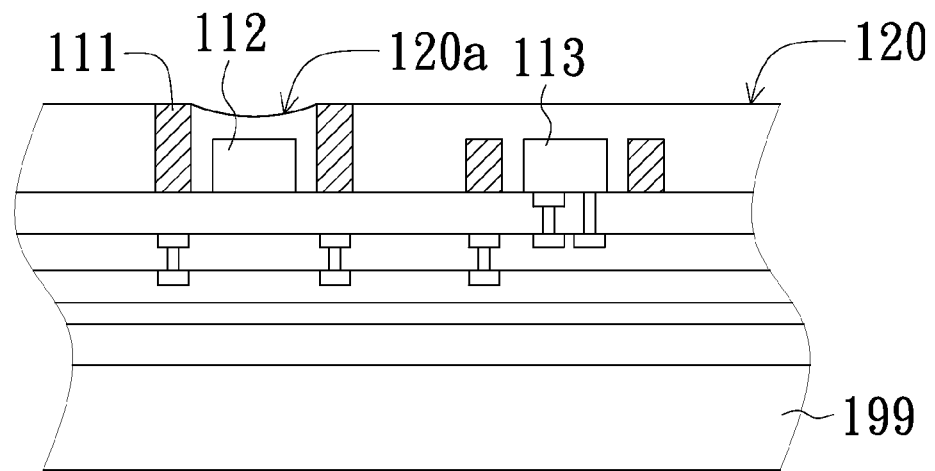

Referring to the cross sectional view shown in FIG. 1C, a first CMP process, which has high polishing rate selectivity, is performed on the second surface 120 to continuously thin the silicon wafer. The first CMP process, the deep trench isolations 111 is used as an polishing stop layer. As the slurry used in the first CMP process has different polishing rate to the silicon material and the material of the deep trench isolations 111 (for example, silicon dioxide), the deep trench isolations 111 is not easily removed after the deep trench isolations 111 are exposed. Thus, a variation of the reflecting light signals and/or the electrical signals representing the polishing resistance can be detected when the deep trench isolations 111 are exposed. Accordingly, the thinning process can be accurately controlled to avoid over-thinning or insufficient thinning. As a result, the thinned silicon wafer has both the good cross-wafer thickness uniformity and the wafer-to-wafer thickness uniformity. In detail, the silicon material 100 of the silicon wafer 100 and the isolation material (e.g., silicon dioxide) have different refractive indexes and different polishing rates in the slurry used in the first CMP process. Therefore, in the present embodiment, the highly selective first CMP process can be performed using the deep trench isolations 111 as the polishing stop layer.

In addition, due to the high polishing rate selectivity, the first CMP process would produce dishing depressions 120a in the second surface 120 of the silicon wafer that is between the deep trench isolations 111.

Figure 1D:
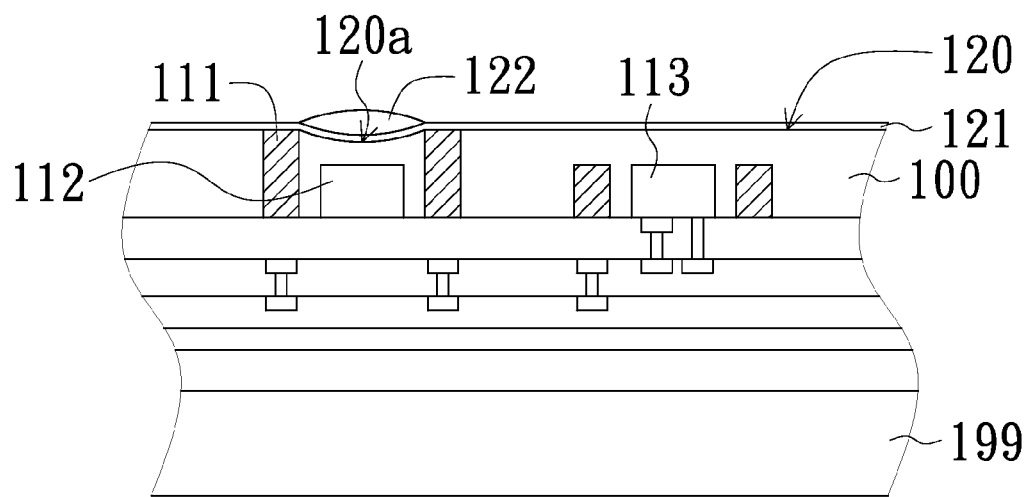

Now referring to the cross sectional view shown in FIG. 1D, to prevent the recombination of the electron-hole pair produced by the image sensing member 112 after receiving external light thereby avoiding reduce the amount of the effect electrical charges, an ion implantation can be performed on the second surface 120. It is to be noted that the thinning process and the ion implantation may produce lattice defect (not shown) in the silicon wafer 100, and this lattice defect would lead to current leakage. To avoid the lattice defect, an annealing process can be used to repair the lattice defect. After the annealing process, an anti-reflection layer 121 can be formed to reduce unwanted reflection of incident light. A microlens 122 is formed above the dishing depression 120a. Because the microlens 122 can be formed to be conformal with the shape of the dishing depression 120a, a surface of the microlens 122 facing the dishing depression 120a is a curved surface. In other words, the microlens in the image sensor is a convex lens having light converging effect. According to the marching direction of incident light, surfaces of a convex lens can be divided into an incident surface and a light emitting surface. Convex lens has convex incident surface and flat light emitting surface is called convex plano lens; convex lens has flat incident surface and convex light emitting surface is called plano convex lens; and convex lens has convex incident surface and convex light emitting surface is called convex-convex lens. Among the above three types of convex lens, if the curvature radius is the same and the incident light is in a parallel direction, the convex-convex lens has the shortest focus length and the convex plano lens has the longest focus length. In other words, if the same focus length is required for the three types of convex lens, the curvature radius of the convex plano lens should be the smallest and that of the convex-convex lens should be biggest. That is, the curved surface of the convex plano lens is more curved and the curved surface of the convex-convex lens is relatively plane.

Compared with font-illuminated image sensor, the distance between the microlens and the image sensing member of back-illuminated image sensor is shorter to improve the amount of incident light. As discussed above, the convex plano lens should has a relative small curvature radius to obtain shorter focus length. Thus, in the fabricating method of a back-illuminated image sensor, the curvature radius should be accurately controlled to obtain precise focus length for efficiently converging light onto the image sensing member. In the present embodiment, the microlens 122 above the dishing depression 120a may be plano convex lens or convex-convex lens relative to the marching direction of the incident light. The plano convex lens or convex-convex has a shorter focus length than the convex plan lens when the curvature radius is the same. Thus, in the fabricating process, it is easier to made the focus length is between the microlens 122 and the image sensing member 112 such that the incident light can be accurately converged onto the image sensing member 112 thereby improving the photo-electric conversion efficiency and also the performance of the back-illuminated image sensor. According to another aspect, in the highly polishing rate selective first CMP process, if the ratio of the polishing rate of the silicon material to the polishing rate of the isolation material is different, the produced dishing depression 120a in the second surface 120 and between the deep trench isolations 111 also has different profile. For example, the higher the polishing rate of the silicon material is, the smaller curvature radius of the dishing depression is obtained; and the smaller curvature radius of the dishing depression is obtained; the smaller curvature radius of the microlens 122 facing the dishing depression 120a is obtained. Therefore, the shape and the curvature of the dishing depression 120a can be controlled by adjusting the composition of the slurry used in the highly polishing rate selective first CMP process. Accordingly, the light emitting surface of the microlens 122 that faces with the dishing depression 120 can be formed into different curvature radius. In the present embodiment, the ratio of the polishing rate of the silicon material to the isolation material in the highly selective first CMP process should be big enough, for example, bigger than 200.

It is to be noted that, the back-illuminated image sensor as shown in the cross sectional view of FIG. 1D can also be fabricated by other methods to form the curved surface of the microlens 122 that faces with the second surface 120. For example, after the silicon wafer is thinned, the second surface is etched to form at least one groove. Then, an anti-reflection layer is formed on the second surface. In succession, another highly polishing rate selective CMP process is performed. The polishing rate of the anti-reflection layer is greater than that of the silicon material. Thus, dishing depressions are formed in the surface of the anti-reflection layer in the groove. Finally, the microlens is formed above the dishing depression in the surface of the anti-reflection layer. As such, the surface of the microlens that faces with the second surface is also a curved surface.

Figure 1E:
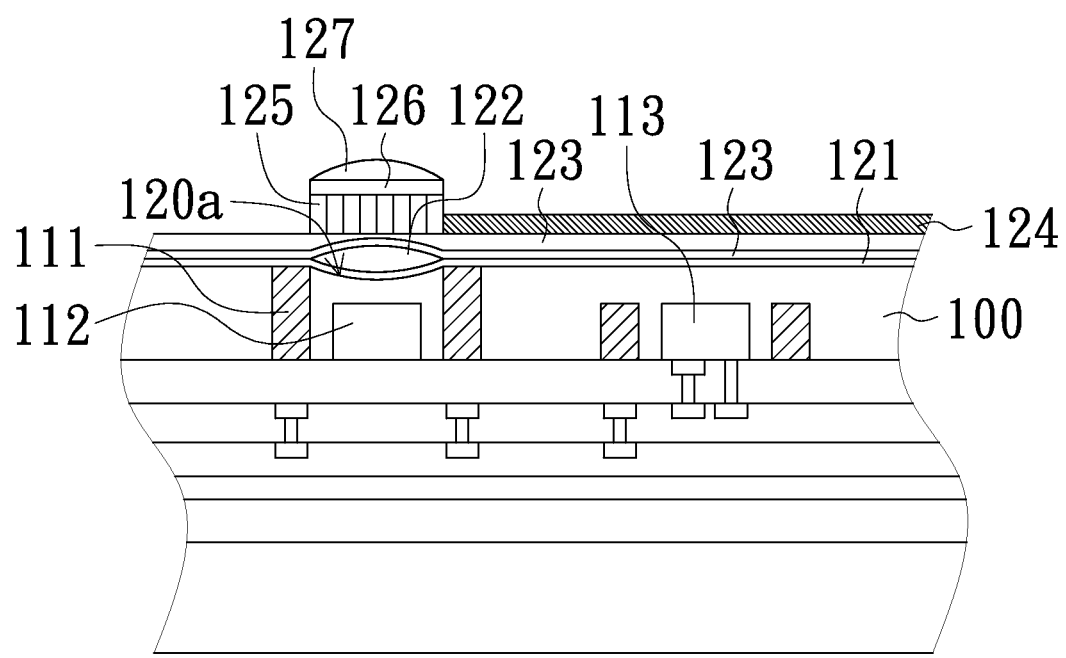

Referring to the cross sectional view shown in FIG. 1E, finally, the fabricating method of a back-illuminated image sensor may further includes the following step: forming a first plane layer 123 on the microlens 122. In addition, a metal shielding layer 124 is formed on the first plane layer 123 to prevent external light directly irradiating the peripheral circuit 113. The metal shielding layer 124 may consist of aluminum, copper or titanium, and the present embodiment doesn't limit the composition. After that, a color filter 125 is formed on the first plane layer 123 and above the microlens 122. Finally, a second plane layer 126 and a second microlens 127 are optionally formed on the color filter 125 thereby obtaining a back-illuminated image sensor. It is worthy to note that, according to the marching direction of the external light, the second microlens 127 is defined as a convex plano lens, and the microlens 122 and the second microlens 127 constitute a two convex combination. In the fabricating process, it is easier to adjust the curvature radius of the light incident surface of the second microlens 127 and accurately control the focus length. As a result, the photo-electric conversion efficiency is improved and the performance of the back-illuminated image sensor is also improved.

In summary, according to the present embodiment, the thinning process of the silicon wafer can be accurately controlled thereby obtaining good cross wafer thickness uniformity and wafer-to-wafer thickness uniformity. Therefore, the focus length of the microlens can also be accurately controlled, the photo-electric conversion efficiency is improved. Thus, the back-illuminated image sensor provided in the present embodiment has better performance and quality.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A back-illuminated image sensor, comprising:
    a silicon wafer, comprising a first surface and a second surface, wherein at least one image sensing member and at least one peripheral circuit are formed in the first surface and at least one right-side up dishing depression is formed in the second surface of the silicon wafer; and
    at least one microlens, disposed above the right-side up dishing depression formed in the second surface of the silicon wafer, and a surface of the microlens facing the second surface of the silicon wafer is a smoothly curving surface which is formed to be conformal with the right-side up dishing depression.

2. The back-illuminated image sensor of claim 1, wherein a plurality of trench isolations are formed in the first surface and the image sensing member is formed between the trench isolations.

3. The back-illuminated image sensor of claim 2, wherein the at least one right-side up dishing depression is formed between the trench isolations.

4. The back-illuminated image sensor of claim 2, wherein a depth of the trench isolations in a direction perpendicular to the first surface is less than or equal to three micrometers.

5. The back-illuminated image sensor of claim 2, wherein an edge of the surface of the microlens is directly next to an end of one of the trench isolations.

6. The back-illuminated image sensor of claim 2, wherein an edge of the right-side up dishing depression touches an end of one of the trench isolations.

7. The back-illuminated image sensor of claim 1, further comprising:
    an anti-reflection layer, disposed on the second surface;
    a first plane layer, disposed on the microlens and the anti-reflection layer;
    a metal shielding layer, disposed on the first plane layer; and
    a color filter, disposed above the microlens, and on the first plane layer.

8. The back-illuminated image sensor of claim 7, further comprising:
    a second plane layer, disposed on the color filter; and
    a second microlens disposed on the color filter.

* * * * *